(12) United States Patent
Woodham, Jr. et al.

(10) Patent No.: US 11,330,722 B2
(45) Date of Patent: *May 10, 2022

(54) APPLIANCE CONTROL PANEL WITH IN-MOLDED ELECTRONIC FILM DIRECTLY MOUNTED TO PRINTED CIRCUIT BOARD

(71) Applicant: Haier US Appliance Solutions, Inc., Wilmington, DE (US)

(72) Inventors: Richard Gary Woodham, Jr., Taylorsville, KY (US); Donald James Leisl, III, Louisville, KY (US)

(73) Assignee: Haier US Appliance Solutions, Inc., Wilmington, DE (US)

( * ) Notice: Subject to any disclaimer, the term of this patent is extended or adjusted under 35 U.S.C. 154(b) by 271 days.

This patent is subject to a terminal disclaimer.

(21) Appl. No.: 16/031,072

(22) Filed: Jul. 10, 2018

(65) Prior Publication Data
US 2020/0019260 A1    Jan. 16, 2020

(51) Int. Cl.
| | |
|---|---|
| *H05K 5/00* | (2006.01) |
| *G06F 3/044* | (2006.01) |
| *H05K 1/09* | (2006.01) |
| *H05K 1/11* | (2006.01) |
| *H05K 1/18* | (2006.01) |
| *H05K 3/34* | (2006.01) |
| *D06F 34/32* | (2020.01) |

(52) U.S. Cl.
CPC ........... *H05K 5/0017* (2013.01); *D06F 34/32* (2020.02); *G06F 3/044* (2013.01); *H05K 1/092* (2013.01); *H05K 1/111* (2013.01); *H05K 1/181* (2013.01); *H05K 3/3431* (2013.01); *H05K 3/3447* (2013.01); *H05K 2201/10151* (2013.01)

(58) Field of Classification Search
CPC ........ G06F 3/044; H05K 1/092; H05K 1/111; H05K 1/181; H05K 3/3431; H05K 5/0017; H05K 3/3447; H05K 2201/10151; D06F 33/00; D06F 2210/00; D06F 2212/02; D06F 34/32
See application file for complete search history.

(56) References Cited

U.S. PATENT DOCUMENTS

| | | | |
|---|---|---|---|
| 5,141,445 A | 8/1992 | Little | |
| 8,514,545 B2 | 8/2013 | Haag | |
| 9,615,468 B2 | 4/2017 | Moncrieff | |
| 9,897,745 B2 | 2/2018 | Chen et al. | |
| 2001/0002649 A1* | 6/2001 | Zeeland | H01H 13/702 200/520 |
| 2004/0129542 A1* | 7/2004 | Kawaguchi | H01H 9/182 200/61.1 |

(Continued)

FOREIGN PATENT DOCUMENTS

WO    WO2015019126 A1    2/2015

*Primary Examiner* — Ahmed M Saeed
(74) *Attorney, Agent, or Firm* — Dority & Manning, P.A.

(57) ABSTRACT

A control panel of an appliance includes a film comprising conductive ink embedded in the film. A header on the film is in electrical communication with the conductive ink embedded in the film. The control panel also includes a printed circuit board. The film is directly mounted to the printed circuit board via the header. With this direct mounting, the printed circuit board is in operative communication with the conductive ink embedded in the film.

20 Claims, 5 Drawing Sheets

(56) References Cited

U.S. PATENT DOCUMENTS

| | | | | |
|---|---|---|---|---|
| 2005/0179673 A1* | 8/2005 | Philipp | ............... | H03K 17/962 |
| | | | | 345/173 |
| 2009/0068864 A1* | 3/2009 | Honda | .................. | H05K 1/116 |
| | | | | 439/83 |
| 2011/0094774 A1* | 4/2011 | Yang | ....................... | H05K 1/09 |
| | | | | 174/254 |
| 2013/0026021 A1* | 1/2013 | Hori | ...................... | H01H 57/00 |
| | | | | 200/5 A |
| 2013/0100628 A1* | 4/2013 | Yamaguchi | ......... | H01R 12/585 |
| | | | | 361/792 |
| 2017/0031475 A1* | 2/2017 | Doering | ............... | F25D 29/005 |
| 2020/0018004 A1* | 1/2020 | Leisl, III | ............... | H05K 1/181 |

* cited by examiner

APPLIANCE CONTROL PANEL WITH IN-MOLDED ELECTRONIC FILM DIRECTLY MOUNTED TO PRINTED CIRCUIT BOARD

FIELD

The present subject matter relates generally to printed circuit boards with in-molded electronic film mounted directly to the printed circuit boards, such as may be used in control panels for appliances.

BACKGROUND

Appliances generally include a control panel having a plurality of buttons, keys, or other input devices. Utilizing the control panel, an appliance user can input control commands to the appliance and operate the appliance. Certain control panels include in-molded film with printed material on the film. For example, the in-molded film may include one or more electronic components formed by printing circuitry onto the film with conductive inks. Such in-molded electronics can decrease an overall size of the control panel and reduce the size and/or number of circuit boards required.

However, such in-molded electronics are typically connected to associated circuit boards with additional intervening connection elements. For example, a cable such as a ribbon cable may be used to connect the in-molded electronics to the circuit board. Such connections may increase the overall size of the control panel and may introduce additional potential failure points. For example, the connectors may work loose over time due to vibrations.

Accordingly, an appliance control panel with in-molded electronics that includes improved features for connecting the in-molded electronics to a circuit board would be useful.

BRIEF DESCRIPTION

Aspects and advantages of the technology will be set forth in part in the following description, or may be apparent from the description, or may be learned through practice of the technology.

In an exemplary embodiment, an appliance defining a vertical direction, a lateral direction and a transverse direction that are mutually perpendicular to one another is provided. The appliance includes a cabinet extending between a top and a bottom along the vertical direction, between a left side and a right side along the lateral direction, and between a front and a rear along the transverse direction. The appliance also includes a control panel disposed on the cabinet. The control panel includes a film comprising conductive ink embedded in the film. A header on the film is in electrical communication with the conductive ink embedded in the film. The control panel also includes a printed circuit board. The film is directly mounted to the printed circuit board via the header. With this direct mounting, the printed circuit board is in operative communication with the conductive ink embedded in the film.

In another exemplary embodiment, a control panel of an appliance is provided. The control panel includes a film comprising conductive ink embedded in the film. A header on the film is in electrical communication with the conductive ink embedded in the film. The control panel also includes a printed circuit board. The film is directly mounted to the printed circuit board via the header. With this direct mounting, the printed circuit board is in operative communication with the conductive ink embedded in the film.

These and other features, aspects and advantages of the present technology will become better understood with reference to the following description and appended claims. The accompanying drawings, which are incorporated in and constitute a part of this specification, illustrate embodiments of the technology and, together with the description, serve to explain the principles of the technology.

BRIEF DESCRIPTION OF THE DRAWINGS

A full and enabling disclosure of the present technology, including the best mode thereof, directed to one of ordinary skill in the art, is set forth in the specification, which makes reference to the appended figures.

DETAILED DESCRIPTION

Figure 1:
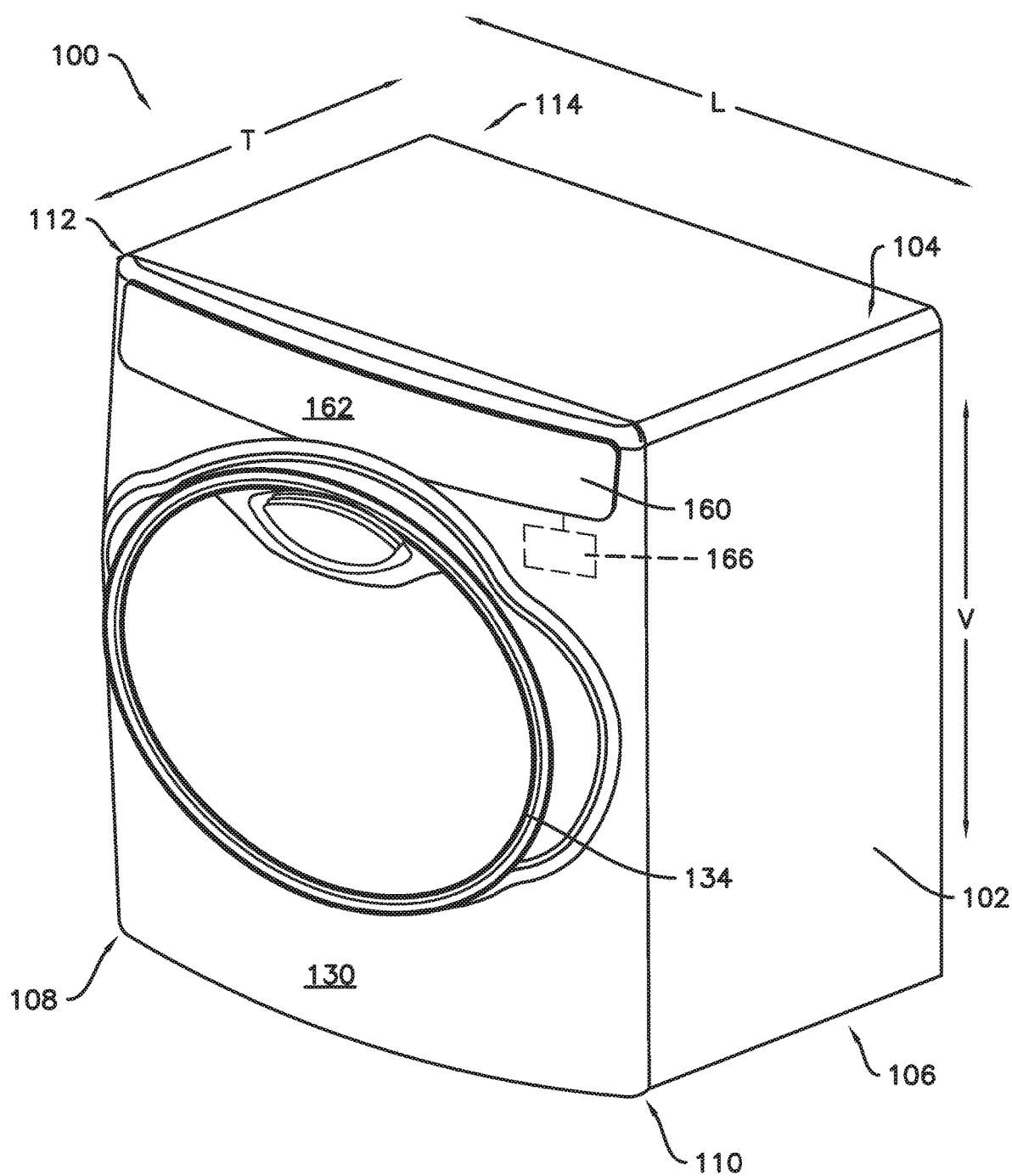
FIG. 1 provides a perspective view of a washing machine appliance as may incorporate a control panel in accordance with at least one embodiment of the present subject matter.

Reference now will be made in detail to embodiments of the technology, one or more examples of which are illustrated in the drawings. Each example is provided by way of explanation of the technology, not limitation of the technology. In fact, it will be apparent to those skilled in the art that various modifications and variations can be made in the present technology without departing from the scope or spirit of the technology. For instance, features illustrated or described as part of one embodiment can be used with another embodiment to yield a still further embodiment. Thus, it is intended that the present technology covers such modifications and variations as come within the scope of the appended claims and their equivalents.

As used herein, terms of approximation such as "generally," "about," or "approximately" include values within ten percent greater or less than the stated value. When used in the context of an angle or direction, such terms include within ten degrees greater or less than the stated angle or direction, e.g., "generally vertical" includes forming an angle of up to ten degrees in any direction, e.g., clockwise or counterclockwise, with the vertical direction V.

FIG. 1 provides a perspective view of an appliance 100 according to an exemplary embodiment of the present subject matter. In the illustrated example, the appliance 100 is a washing machine appliance. In other examples, the appliance 100 may be a dryer appliance, a refrigerator, an oven, e.g., a range appliance or a microwave oven, a dishwasher, or any other suitable household appliance. It should be understood that the present disclosure is not limited to washing machine appliances 100, and that any suitable appliance having a control panel is within the scope and spirit of the present disclosure.

FIG. 1 is a perspective view of an exemplary washing machine appliance 100. As illustrated, washing machine appliance 100 generally defines a vertical direction V, a lateral direction L, and a transverse direction T, each of which is mutually perpendicular, such that an orthogonal coordinate system is generally defined. Washing machine appliance 100 includes a cabinet 102 that extends between a top 104 and a bottom 106 along the vertical direction V, between a left side 108 and a right side 110 along the lateral direction L, and between a front 112 and a rear 114 along the transverse direction T.

As illustrated for example in FIG. 1, cabinet 102 includes a front panel 130 with a door 134 rotatably mounted to front panel 130. Door 134 includes a handle (not shown) that, e.g., a user may pull when opening and closing door 134. Further, although door 134 is illustrated as mounted to front panel 130, it should be appreciated that door 134 may be mounted to another side of cabinet 102 or any other suitable support according to alternative embodiments.

A control panel 160 is disposed on the cabinet 102, e.g., coupled to front panel 130 as in the illustrated embodiment. Control panel 160 defines an outer surface 162. The control panel 160 and outer surface 162 may be part of a user interface for operator selection of machine cycles and features. As one example of such user interface, the control panel 160 may be used as part of a capacitive touch sensing system to allow for the selective activation, adjustment, or control of the washing machine appliance 100. In such embodiments, the control panel 160 may include a dielectric panel of the capacitive touch system whereby the capacitive touch system registers touches on the outer surface 162. The user interface may also provide for the selective activation, adjustment, or control of any timer features or other user-adjustable inputs. One or more of a variety of electrical, mechanical or electromechanical input devices including rotary dials, push buttons, toggle/rocker switches, and/or touch pads can also be used in combination with the capacitive touch input components. Control panel 160 may also include a display component, such as a digital or analog display device designed to provide operational feedback to a user.

Also, although described with respect to washing machine appliance 100, it should be readily understood that a user interface as described herein could be used with any suitable appliance. Examples of such other appliances include but are not limited to: dryer appliances, cooking appliances, and/or refrigerator appliances. Control panel 160 may be constructed of glass, ceramics, plastics, and/or combinations thereof. Suitable plastic materials may include acrylics, polyethylene terephthalate ("PET"), or the like. In some embodiments, a touch screen may be incorporated into or may form the control panel of an appliance; for example, the touch screen or control panel may be incorporated into a backsplash of a cooktop or dryer appliance.

Operation of washing machine appliance 100 can be regulated by a controller 166 that is operatively coupled, i.e., in communication with, control panel 160. By way of example, the controller 166 may include a memory and one or more processing devices such as microprocessors, CPUs or the like, such as general or special purpose microprocessors operable to execute programming instructions or micro-control code associated with operation of appliance 100. The memory may represent random access memory such as DRAM, or read only memory such as ROM or FLASH. The memory may be a separate component from the processor or may be included onboard within the processor. In one embodiment, the processor executes programming instructions stored in memory.

The controller 166 may be positioned in a variety of locations throughout washing machine appliance 100. In the illustrated embodiment, e.g., as shown in FIG. 1, the controller 166 may be located under or next to the control panel 160. In such an embodiment, input/output ("I/O") signals are routed between the controller 166 and various operational components of appliance 100 such as control panel 160, sensors, graphical displays, and/or one or more alarms. In one embodiment, the control panel 160 may represent a general purpose I/O ("GPIO") device or functional block. Control panel 160 may be in communication with the controller 166 via a direct connection, e.g., without intervening cables or terminations. A user of washing machine appliance 100 may input and receive information regarding the operation of washing machine 100 at control panel 160. A variety of text, digits, and/or symbols may be printed on control panel 160. In some embodiments, no text, digits, or symbols may appear on control panel 160 unless washing machine appliance 100 is in use.

Figure 2:
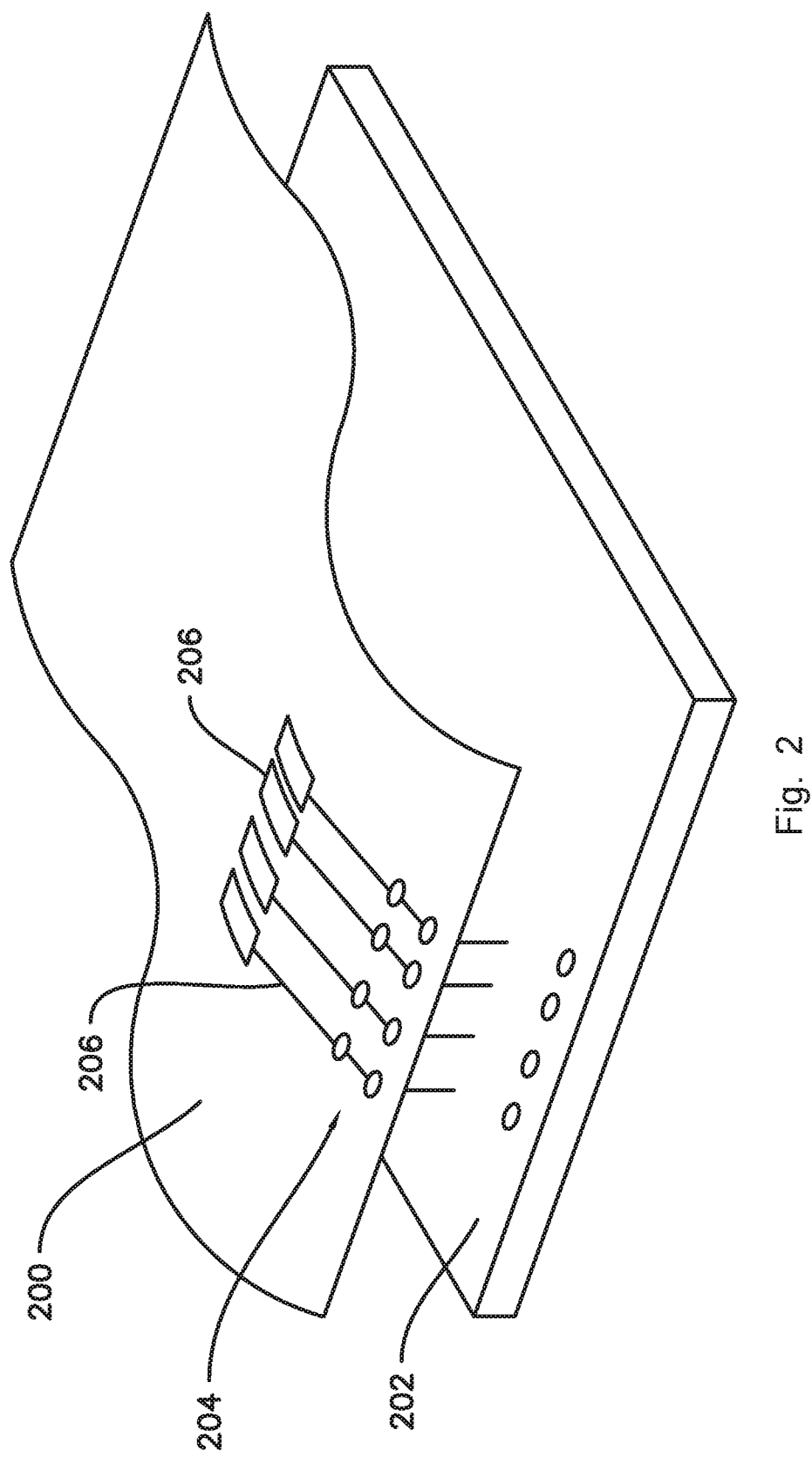
FIG. 2 provides a perspective view of components of a control panel which may be incorporated into an appliance such as the exemplary washing machine appliance of FIG. 1.

Some or all of the above-described components of the controller 166 may be provided on a printed circuit board (PCB), such as the printed circuit board 202 shown in FIG. 2. In such embodiments, the control panel 160 may include a film 200 having conductive ink 206 embedded in the film 200. One or more electronic components may be formed by the conductive ink. A header 204 may be provided in the film 200 for directly mounting the film 200 to the printed circuit board 202, e.g., without the use of a separate cable or other connector and associated terminals. When the film 200 is directly mounted to the printed circuit board 202 via the header 204, an electrical connection is thereby established such that the printed circuit board 202 (e.g., including a controller 166 thereon) is in operative communication with the conductive ink 206 embedded in the film 200, e.g., the electronic component(s) formed by the conductive ink 206.

In some embodiments, the control panel 160 may include a capacitive touch sensor, whereby appliance 100 is controlled at least in part through touch inputs on control panel 160, and more particularly on outer surface 162 thereof, by a user of the appliance 100. The capacitive touch sensor may include one or more capacitive components formed of the conductive ink 206 which is embedded in the film 200. In some embodiments, the conductive ink 206 in the film 200 may define at least one touch area of the capacitive touch sensor. For example, the conductive ink 206 may be applied to the film 200 by printing methods which are generally understood in the art. The film 200 including the conductive ink 206 therein may be in-molded into a component such as a housing or frame of the control panel 160 which is molded of a suitable plastic material. The capacitance of the touch sensor(s) of the control panel 160, in particular changes therein, may be measured and/or monitored by the controller 166 to detect a touch input from a user. For example, the controller 166 on the printed circuit board 202 may be in communication with the components formed of conductive ink 206 in the film 200 by a direct connection between the film 200 and the printed circuit board 202 via the header 204, e.g., as in the example embodiments described below.

Figure 3:
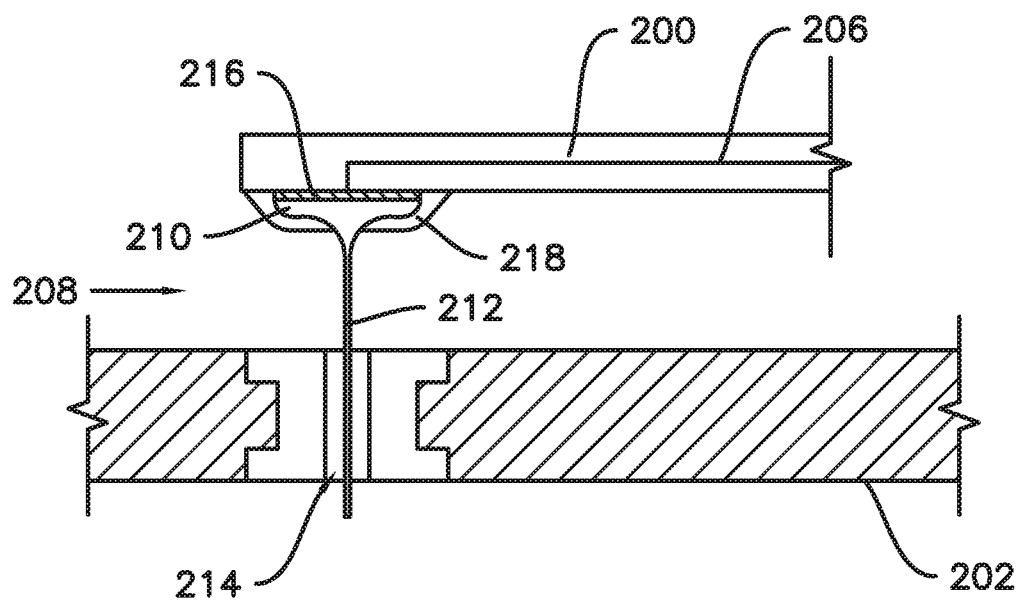
FIG. 3 provides a side section view of the components of FIG. 2 according to one or more embodiments of the present subject matter.
Figure 4:
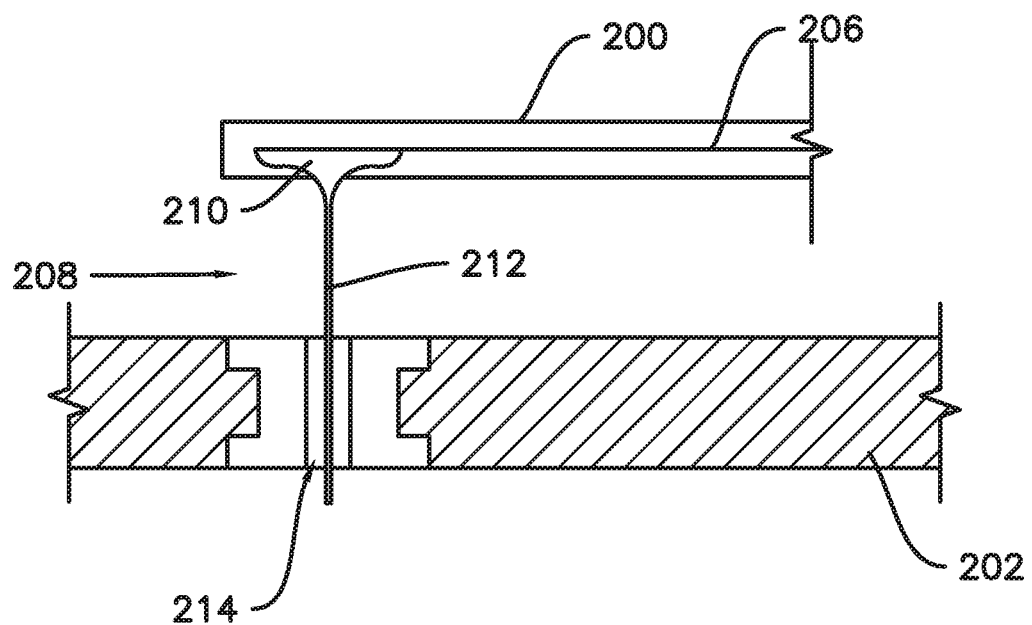
FIG. 4 provides a side section view of the components of FIG. 2 according to one or more further embodiments of the present subject matter.
Figure 5:
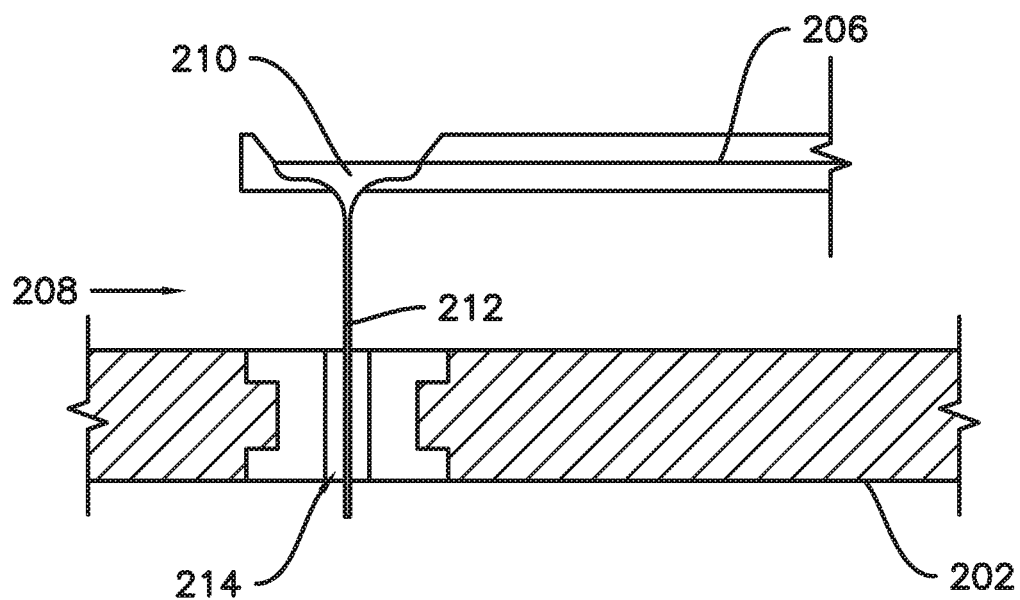
FIG. 5 provides a side section view of the components of FIG. 2 according to one or more still further embodiments of the present subject matter.
Figure 6:
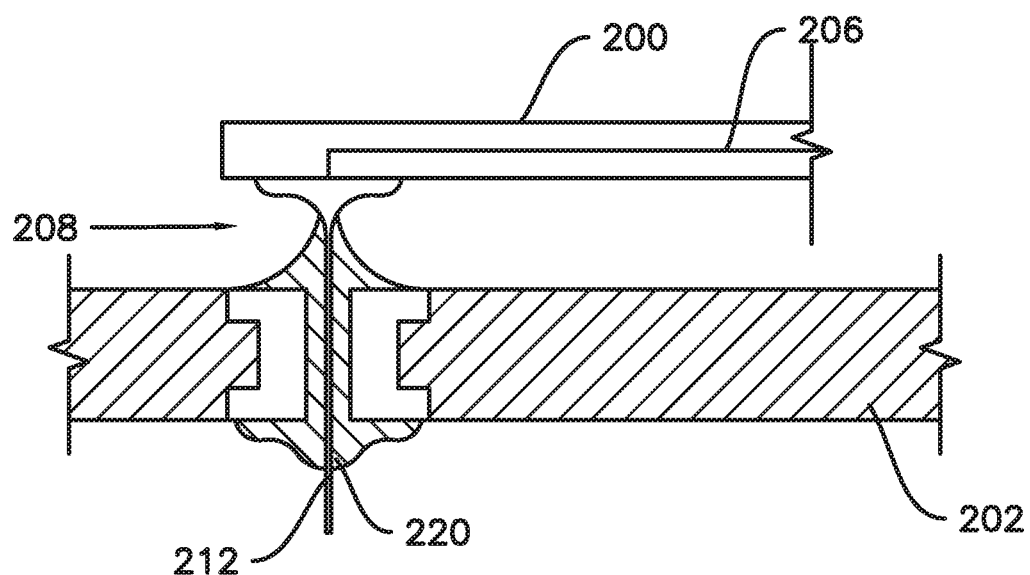
FIG. 6 provides a side section view of the components of FIG. 2 in a directly connected position according to one or more embodiments of the present subject matter.

In some embodiments, as illustrated for example in FIGS. 3 through 6, the header 204 may include at least one pin 208 and the printed circuit board 202 may include a corresponding number of thru holes 214 (FIGS. 3-5). In such embodiments, the film 200 may be directly mounted to the printed circuit board 202 by the pin 208 and the thru hole 214, for example with the pin 208 soldered into the thru hole 214 of the printed circuit board 202, as illustrated in FIG. 6, where the solder joint is indicated by 220.

In various embodiments, the pin 208 may include a base portion 210 and an elongate portion 212 extending from the base portion 210. The base portion 210 may be in direct contact with the film 200 and the elongate portion 212 may extend from the base portion 210 and away from the film 200. For example, the elongate portion 212 of the pin 208 may extend towards the printed circuit board 202, e.g., to and through the thru hole 214 in the printed circuit board 202, as shown. In various embodiments, at least the base portion 210 of the pin 208 may be integrated into the film 200. For example, as illustrated in FIG. 3, the pin 208 may be adhered to the film 200 with a conductive adhesive 216 and sealed to the film 200. For example, the pin 208, e.g., the base portion 210 thereof, may be sealed to the film 200 with an additional layer 218 of film material. As another example, as illustrated in FIG. 4, the base portion 210 may be embedded in the film 200. In yet another example, the pin 208 may be crimped to the film 200, e.g., as illustrated in FIG. 5.

Figure 7:
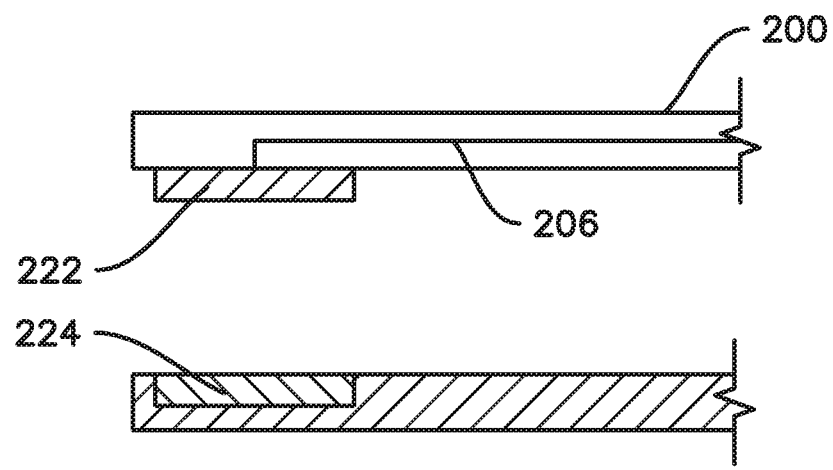
FIG. 7 provides a side section view of the components of FIG. 2 according to one or more additional embodiments of the present subject matter.
Figure 8:
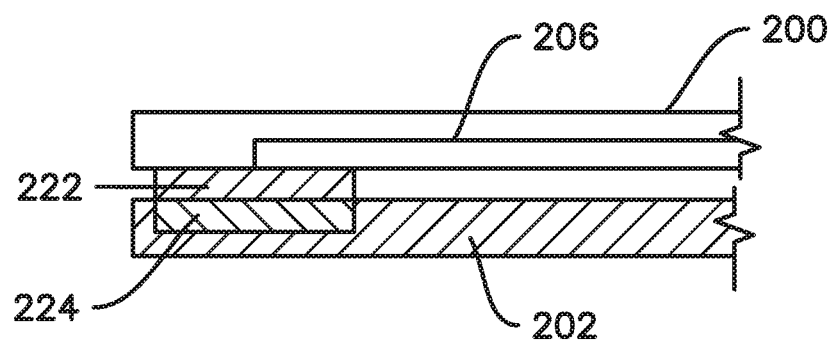
FIG. 8 provides a side section view of the components of FIG. 7 in a directly connected position.

As shown in FIGS. 7 and 8, in some embodiments the film 200 may be surface mounted to the printed circuit board 202 by joining a conductive surface on the film 200 to a conductive surface on the printed circuit board 202. For example, the header 204 may include a solder pad 222 on the film 200. For example, the conductive ink 206 may be a solderable ink, such as a carbon-type solderable conductive ink. In such embodiments, the solder pad 222 may be provided as an exposed portion of the conductive ink 206. The printed circuit board 202 may include a solder pad 224 thereon. The solder pads 222 and 224 each comprise a conductive material, thus each of the solder pads 222 and 224 provides a conductive surface on each of the film 200 and the printed circuit board 202, respectively. Thus, the film 200 may be directly mounted to the printed circuit board 202 with a conductive surface to conductive surface bonded interface, e.g., by soldering the exposed portion 222 of the conductive ink 206 to the solder pad 224 on the printed circuit board 202.

It should be understood that the descriptions herein of an appliance are but one example of a possible field of use for the control panel. The exemplary control panel described herein may also be used in various other contexts, such as but not limited to, automotive controls, industrial controls, or other similar applications.

This written description uses examples to disclose the technology, including the best mode, and also to enable any person skilled in the art to practice the technology, including making and using any devices or systems and performing any incorporated methods. The patentable scope of the technology is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. An appliance defining a vertical direction, a lateral direction and a transverse direction that are mutually perpendicular to one another, the appliance comprising:
    a cabinet extending between a top and a bottom along the vertical direction, between a left side and a right side along the lateral direction, and between a front and a rear along the transverse direction; and
    a control panel disposed on the cabinet, the control panel comprising:
        a film comprising an inner surface, an outer surface parallel to and opposite the inner surface, and conductive ink embedded in the film between the inner surface and the outer surface with the conductive ink spaced apart from each of the inner surface and the outer surface;
        a header on the film in electrical communication with the conductive ink embedded in the film; and
        a printed circuit board, the film directly mounted to the printed circuit board via the header, whereby the printed circuit board is in operative communication with the conductive ink embedded in the film.

2. The appliance of claim 1, wherein the conductive ink in the film defines at least one touch area of a capacitive touch sensor.

3. The appliance of claim 1, wherein the header comprises a pin, the printed circuit board includes a thru hole, and the film is directly mounted to the printed circuit board by the pin and the thru hole.

4. The appliance of claim 3, wherein the pin is conductively adhered to the film and sealed to the film.

5. The appliance of claim 3, wherein the pin comprises an elongate portion and a base portion, the base portion embedded in the film.

6. The appliance of claim 3, wherein the pin is crimped to the film.

7. The appliance of claim 3, wherein the pin is soldered into the thru hole of the printed circuit board.

8. The appliance of claim 1, wherein the header comprises an exposed portion of the conductive ink and the exposed portion of the conductive ink comprises a carbon-type solderable conductive ink.

9. The appliance of claim 1, wherein the film is directly mounted to the printed circuit board with a conductive surface to conductive surface bonded interface.

10. The appliance of claim 8, wherein the film is directly mounted to the printed circuit board by soldering the exposed portion of the conductive ink to a solder pad on the printed circuit board.

11. A control panel of an appliance, the control panel comprising:
    a film comprising an inner surface, an outer surface parallel to and opposite the inner surface, and conductive ink embedded in the film between the inner surface and the outer surface with the conductive ink spaced apart from each of the inner surface and the outer surface;
    a header on the film in electrical communication with the conductive ink embedded in the film; and
    a printed circuit board, the film directly mounted to the printed circuit board via the header, whereby the printed circuit board is in operative communication with the conductive ink embedded in the film.

12. The control panel of claim 11, wherein the conductive ink in the film defines at least one touch area of a capacitive touch sensor.

13. The control panel of claim 11, wherein the header comprises a pin, the printed circuit board includes a thru hole, and the film is directly mounted to the printed circuit board by the pin and the thru hole.

14. The control panel of claim 13, wherein the pin is conductively adhered to the film and sealed to the film.

15. The control panel of claim 13, wherein the pin comprises an elongate portion and a base portion, the base portion embedded in the film.

16. The control panel of claim 13, wherein the pin is crimped to the film.

17. The control panel of claim 13, wherein the pin is soldered into the thru hole of the printed circuit board.

18. The control panel of claim 11, wherein the header comprises an exposed portion of the conductive ink and the exposed portion of the conductive ink comprises a carbon-type solderable conductive ink.

19. The control panel of claim 11, wherein the film is directly mounted to the printed circuit board with a conductive surface to conductive surface bonded interface.

20. The control panel of claim 18, wherein the film is directly mounted to the printed circuit board by soldering the exposed portion of the conductive ink to a solder pad on the printed circuit board.

* * * * *